United States Patent
Reddy

[19]

[11] Patent Number: 6,094,110
[45] Date of Patent: Jul. 25, 2000

[54] RF CHOKE WITH WINDINGS LOCATED AT TWO DIFFERENT CORE DIAMETERS

[75] Inventor: Prabhakara Reddy, The Woodlands, Tex.

[73] Assignee: National Electronic Devices, Inc., Conroe, Tex.

[21] Appl. No.: 09/193,893

[22] Filed: Nov. 18, 1998

[51] Int. Cl.[7] .................................................. H03H 7/06
[52] U.S. Cl. ..................... 333/181; 333/172; 333/185; 336/212
[58] Field of Search .................................... 333/172, 181, 333/185; 336/180, 211, 212

[56] References Cited

U.S. PATENT DOCUMENTS

| 2,351,604 | 6/1944 | Ferrill, Jr. ................................ 336/180 |
| 2,591,081 | 4/1952 | Lyman et al. . | |
| 4,128,818 | 12/1978 | Scherba .............................. 336/220 X |
| 4,236,127 | 11/1980 | Scherba .................................. 333/175 |
| 4,641,115 | 2/1987 | Bailey .................................... 333/181 |
| 5,032,808 | 7/1991 | Reddy .................................... 333/181 |
| 5,091,707 | 2/1992 | Wollmerschauser et al. ............ 333/12 |
| 5,179,334 | 1/1993 | Reddick .............................. 333/181 X |
| 5,483,208 | 1/1996 | Spriester ................................ 333/131 |
| 5,805,042 | 9/1998 | Chastain et al. .................... 333/181 X |

Primary Examiner—Justin P. Bettendorf
Attorney, Agent, or Firm—Wall Marjama Bilinski & Burr

[57] ABSTRACT

This invention relates to a radio frequency ("RF") choke having improved insertion loss and reduced hum modulation. The RF choke includes three conductors wound in series around an elongated core. The first conductor forms a first group of windings where each turn abuts the next turn. The second conductor forms a second group windings where each turn is spaced from the next. The third conductor forms a third group of windings where each turn abuts the next turn. The second and third groups of windings are wound in an opposite direction around the core than the first group of windings. The elongated core can include two separate diameters. A plurality of resistors are electrically connected to said conductors to provide an impedance that effectively blocks an RF signal at between 5 MHz and 1000 MHz. This type of choke can be employed in numerous circuits, including line splitters and couplers, trunk amplifiers, bridge amplifiers and line extender amplifiers.

19 Claims, 2 Drawing Sheets

RF CHOKE WITH WINDINGS LOCATED AT TWO DIFFERENT CORE DIAMETERS

FIELD OF THE INVENTION

This invention relates generally to a radio frequency (RF) choke, and more specifically concerns a choke for separating an AC power wave from a broadband signal, where both are carried on the same conductors.

BACKGROUND OF THE INVENTION

It is common in CATV distribution systems to use a broadband signal (e.g. 50 to 1000 MHz) to carry the various channels and other information to the subscribers, another broadband signal (e.g. 5 to 40 MHz) to carry information from the subscribers to the cable distribution station, and 60 Hz single phase power to operate amplifiers and other devices located at various points on the cable system. In such systems, the broadband signals and AC power are typically each carried on the same transmission line, e.g., the center conductor and braid of a coaxial cable.

Each of the broadband signals originate from a central location. The coaxial cables used to carry these signals inherently have loss characteristics. Thus, amplifier stations must be installed at appropriate locations along the cable in order to compensate for the losses and deliver faithful broadband ("RF") signals. The single phase AC power signal is needed to operate the amplifier stations.

The power signal is passed along the cable concurrently with the RF signal. The power level of the AC signal is much greater than that of the RF signal, and uses different and separate circuitry to operate the amplifier station. Therefore, the AC power signal must be separated from the RF signal at each of the amplifier stations.

It is common practice to use an RF choke and a capacitor to separate the single-phase AC power signal from the broadband RF signals at points along the cable where the RF signal is to be processed in an RF device. After passing the device, the AC power is recombined with the broadband signal, requiring the use of a second RF choke.

The AC power has a current magnitude up to 15 amperes at 60 volts. On the other hand, the broadband RF signal has a low peak voltage of about 0.3 volts. When isolating the AC power from an RF device, the chokes must prevent the RF broadband signal from passing through the choke along the AC power path in order to avoid a significant loss of signal.

One choke, developed by the present inventor which solves many of the problems in the art, is described in U.S. Pat. No. 5,032,808 which is incorporated herein by reference. The choke described in the '808 patent comprises a series of three sets of windings, each of which has a distinct number turns wound upon a core having a uniform cross sectional area along its entire length. The first set of windings is connected at one end to an input lead and at an opposite end to the second set of windings through an air coil inductor. The second set of windings is similarly connected to one end of a third set of windings by means of a second air coil inductor. The output end of the third set of windings in turn is connected to an output lead.

A commercial RF choke is typically constituted by a number of turns of insulated copper wire wound upon a ferrite coil form. A resistor can be connected in parallel with a portion of this wire coil, e.g., from a preselected turn to one of the lead wires, to serve as a shunt. This parallel resistor is selected so that it does not significantly reduce the impedance of the RF choke. There is an effective capacitance between turns of the wire coil, which produces a self-capacitance that combines with the coil inductance to produce an LC resonance. Typically, such resonances unfortunately often lie within the band of the broadband RF signal. The effect of the shunt resistance is to reduce the Q of the LC resonance, thereby blunting the sharpness of any in-band resonances.

A reduction in the number of turns of the wire coil can push any LC resonances above the passband, but this reduction will also result in a reduction in inductance, limiting the suitability of the choke at the 5 MHz low end of the band. The presence of the shunt resistor in the above-described choke also reduces the signal impedance to ground, thereby increasing the signal loss.

In addition to the effects on frequency response, the RF chokes used in the equipment of the cable system must be capable of passing several amperes of AC current. The wire used for the coil must therefore be large enough to carry relatively high currents, usually up to 15 amperes in such cable transmission systems, without becoming excessively warm. Unfortunately, the larger the wire size the more troublesome the related parasitic resonance problem becomes. High currents also pose problems in that core materials are likely to approach saturation, thereby presenting the RF signals with an impedance which varies at the frequency rate of the single phase AC power signal. The effect of this is an unwanted modulation of RF signals commonly referred to as "hum mod".

The above described problems related to high AC current can be effectively reduced by careful selection of wire size, core material, core geometry, shunt resistors and winding dimensions. Many RF chokes have been used to give good performance to the 5 MHz to 450 MHz frequency range. However, when these chokes are used for the 5 MHz to 1,000 MHz frequency range, they exhibit a moderate amount of insertion losses at about 750 MHz. High attenuation of signal results when the losses are allowed to cascade over many circuits. It is desirable to maximize the reduction of insertion losses as many chokes are cascaded over large networks. Thus, savings of even the smallest amount of insertion loss manifests into a substantial amount of power savings over a large network.

Cable system capabilities are needed for extended bandwidths and upper frequency limits beyond 750 MHz to 1 GHz and higher. Therefore, a need exists for an improved RF choke which overcomes the problems and shortcomings associated with the prior art.

SUMMARY OF THE INVENTION

In accordance with the present invention, an improved RF choke is disclosed for use in cable and telephone systems over which RF signals and AC power signals are each transmitted and distributed.

It is an object of this invention to provide an improved RF choke.

Another object of this invention is to separate RF signals from AC power signals on a cable network using a choke having reduced insertion loss as well as reduced hum modulation at radio frequencies of between about 5 MHz and 1 GHz.

It is a further object of the invention to reduce the insertion loss of an RF choke to save substantial amount of power which is usually lost when circuits incorporating the RF choke are cascaded in a large network.

The present invention further improves the art by providing an RF choke comprising a cylindrical core having respective first and second diameters and a wire coil wound upon said core. The wire coil comprises three groups of windings that are connected in series. The first group of windings are wound in a first direction around one of said core diameters. The second and third groups of windings are wound in the opposite direction about the other of said core diameters. Each group of windings has a predetermined number of turns. A pluality of resistors are connected to said windings.

The foregoing and other objects of the present invention as well as the invention itself, may be more fully understood from the following Detailied Description of the Invention when read in conjunction with the accompanying drawings herein:

DETAILED DESCRIPTION OF THE PREFERRED EMBODIMENT

Figure 1:
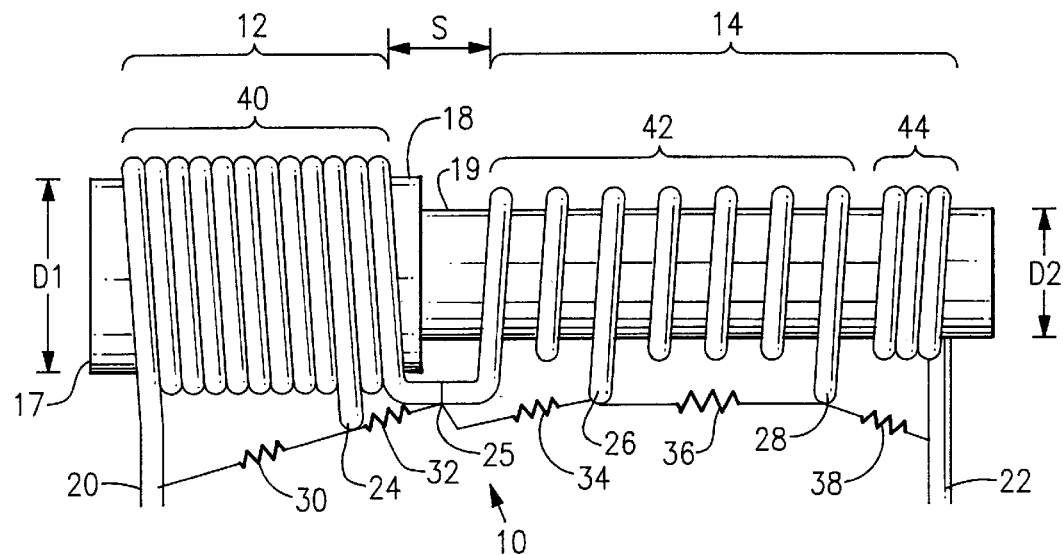
FIG. 1 is a perspective view of an RF choke in accordance with a preferred embodiment of the invention.
Figure 2:
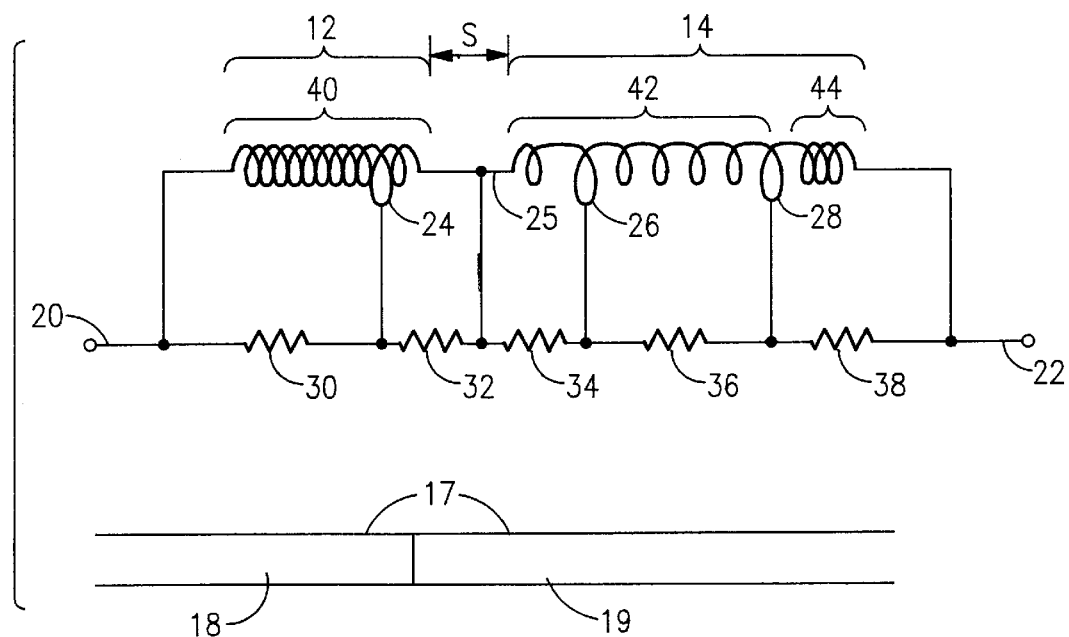
FIG. 2 is a schematic diagram of the RF choke of FIG. 1.

Referring to FIGS. 1 and 2, there is shown an RF choke 10, having two conductors 12 and 14 wound in series upon a cylindrically shaped elongated core 17. The conductors 12 and 14 are of a suitable gauge (preferably a copper and polyurethane insulated 15 AWG wire type, although other wire sizes may be used), having a predetermined thickness. An unconnected end of the first conductor 14 will be referred to as the input lead 22 and an unconnected end of the second conductor 12 will be referred to as the output lead 20.

The elongated core 17 is preferably a ferrite material. In the preferred embodiment, the elongated core 17 is stepped, meaning that it contains two sections each having a different diameter. Core section 18 is larger than core section 19. It is preferable that core section 18 and core section 19 are of ferrite material having similar flux densities. The smaller diameter core 19 allows for a lower inductance and a lower self-capacitance, which gives an improved performance at higher frequencies.

The core sections 18 and 19 are secured together, usually by glue, to form the elongated core 17 having a stepped configuration.

The RF signals and the AC power signals are each transmitted onto the input lead 22 and exit RF choke 10 at output lead 20. The first conductor 12 is wound a predetermined number of turns around the larger core section 18 and forms a first winding group 40. Each turn in the first winding group 40 is contiguous with at least one other turn of the group 40. In addition, a preselected turn of the first winding group 40 can be a raised loop 24, as illustrated in FIG. 1.

The second conductor 14 is connected in series with the first conductor 12, but is wound around the smaller core section 19 in an opposite direction when compared to the direction of the winding of the first conductor 12. Similarly, the second conductor 14 has a predetermined number of turns to form a second winding group 42 and a third winding group 44. Each turn in the second winding group 42 could be spaced or contiguous with an adjacent turn in the group 42. A preselected turn of the second winding group 42 can be a raised loop 26, as shown.

In the second winding group 42, the spacing of the turns gives the presently described RF choke 10 a better frequency response at higher frequencies.

The third winding group 44 is connected in series with the second winding group 42 and wound in the same direction about the smaller core section 19 in the manner previously described. Preferably, each turn in the third winding group 44 is contiguous with at least one other turn of the group 44.

The opposite direction of the windings of the two conductors 12 and 14 cancels any flux that might be generated in either winding when their phase angle is favorable. The two conductors 12 and 14 could be made from the same or different material.

As shown in FIGS. 1 and 2, a space S is defined between the last turn of the first conductor 12 and the first turn of the second conductor 14 for cancelling flux generated in the windings. At RF frequencies, a wider space S decreases flux cancellation, thereby increasing inductance of the RF choke, while a smaller space S increases flux cancellation at RF frequencies thereby reducing inductance of the RF choke. However, at low frequencies of the AC power signal, the size of the space S does not significantly alter cancellation of flux induced by the AC power signals.

A series of resistors 30, 32, 34, 36 and 38 having preselected values are connected in parallel across preselected turns of the conductors 12 and 14 and other preselected turns of the conductors 12 and 14 or the input and output leads 22 and 20. The resistors 30, 32, 34, 36 and 38 are typically used to damp resonance frequencies.

According to the present embodiment, resistor 30 is connected between the output lead 20 and a preselected turn, which can be a raised loop 24, of the first winding group 40. Resistor 32 is connected between the preselected turn, which can be a raised loop 24, of the first winding group 40 and the beginning of the first turn 25 of the second winding group 42. Resistor 34 is connected between the beginning of the first turn 25 of the second winding group 42 and a first preselected turn, which can be a raised loop 26, of the second winding group 42. Resistor 36 is connected between the first preselected turn, which can be a raised loop 26, of the second winding group 42 and a second preselected turn 28 of the second winding group 42. Finally, resistor 38 is connected between a second preselected turn 28 of the second winding group and the input lead 22 of the third winding group 44.

As is known, cable transmission and distribution systems vary in bandwidth of the RF signals and AC current carrying capacity and will therefore affect the choke configuration. Thus, the above description is exemplary and is not intended to be limiting, as numerous modifications and variations are possible.

In a preferred embodiment, the diameter D1 of core section 18 is approximately 0.38 inches. The diameter D2 of core section 19 is approximately 0.32 inches. The length of core 18 is approximately 0.91 inches and the length of core 19 is approximately 0.91 inches. It is preferable that cores 18 and 19 are of similar flux densities.

In the preferred embodiment, the number of turns of the first winding group 40 is twelve, with the eighth turn from the output lead 20 forming a raised loop 24. The preferred number of turns of the second winding group 42 is seven, with the third and seventh turns from the interconnection between the first and second winding groups 25 forming raised loops 26 and 28. The third winding group 44 is wound about the core 19 between raised loop 28 and input lead 22 with preferably three turns.

In the preferred embodiment, only resistors 30, 34 and 36 are included. The resistor 30 having a value of approximately 750 ohms is connected between the output lead 20 and the raised loop 24 of the first winding group 40. The resistor 34 having a value of approximately 510 ohms is connected between the interconnection between the first and second winding groups 25 and the first preselected turn, which is a raised loop 26, of the second winding group 42. The resistor 36, having a value of approximately 1800 ohms, is connected between the raised loop 26 of the second winding group 42 and a second preselected turn, which is also a raised loop 28, of the second winding group 42. As noted, the above embodiment is exemplary, therefore parameters relating the resistors and each of the winding groups can be varied within the concepts of the present invention.

Figure 3:
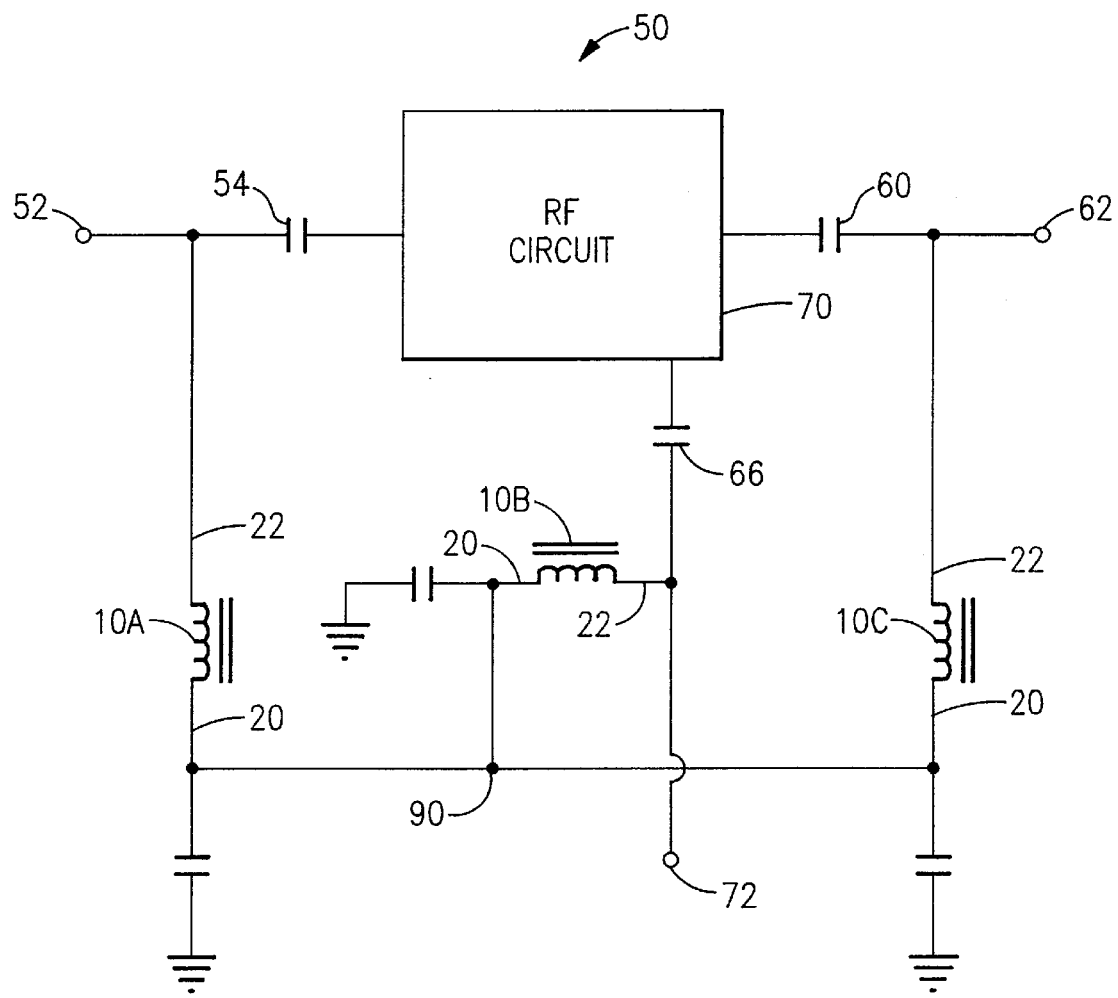
FIG. 3 is a schematic diagram of a line splitter circuit employing the RF chokes of FIGS. 1 and 2.

FIG. 3 illustrates the present RF choke 10 being used in a line splitter circuit 50. In a line splitter circuit 50, the RF signal is split so that it passes onto two or more output terminals. In the circuit shown in FIG. 3, input terminal 52 of the line splitter circuit 50 contains both RF signal and AC power signal. The signals are separated at RF chokes 10A, 10B and 10C. All of the AC power signal and virtually none of the RF signal pass through RF choke 10A, 10B and 10C. The RF signal passes across capacitors 54, 60 and 66, while AC power signal is blocked by capacitors 54, 60 and 66.

Still referring to FIG. 3, the line splitter circuit 50 includes one input terminal 52 and two output terminals 62 and 72. As the RF signal and AC power signal each pass through input terminal 52, the RF signal passes through capacitor 54 to an RF circuit 70 where the RF signal is split into two RF signals. After passing through the RF circuit 70 the RF signal passes through capacitors 60 and 66 and onto output terminals 62 and 72. RF chokes 10A, 10B and 10C block the RF signal and force the signal between input terminals 52 to output terminals 62 and 72 in the manner described.

As the RF signal and AC power signal pass through input terminal 52, the AC power signal passes through RF choke 10A and then is split at node 90. The split AC power signal then passes through RF chokes 10B and 10C to output terminals 62 and 72 where it recombines with the RF signal. Capacitors 54, 60 and 66 prevent the AC power from passing into the RF circuit 70.

As can readily be seen, RF circuit 70 can be replaced by many other types of circuits including a line extender amplifier, bridge amplifier, trunk amplifier, line coupler, line equalizer, power inserter, etc. In fact, RF circuit 70 can perform more than one of these fuinctions together. In each of these RF circuits it is important that the AC power signal and RF signal be separated so that the RF circuit can process the RF signal.

Alternately, the circuit 50 of FIG. 3 can be easily modified by changing the number of output terminals. For example, an additional output terminal could be added to line splitter circuit 50 to have a three way splitter.

While the present invention has been particularly shown and described with reference to the embodiments illustrated in the drawings, it will be understood by one skilled in the art that various changes in detail may be effected therein without departing from the spirit and scope of the invention.

What is claimed is:

1. An RF choke comprising:
   an elongated core having respective first and second diameters;
   a first group of windings defining a first conductor wound around one of said core diameters;
   a second conductor defined by respective second and third groups of windings wound around the other of said core diameters, each of said second and third groups of windings being wound around said core in a winding direction which is opposite a winding direction of said first group windings;
   each of said first, second and third groups of windings are connected to each other at respective ends in series, with said second group being disposed between said first and third groups of windings;
   a plurality of resistors connected to said first and second conductor; and
   a space (S) located between the last turn of the first conductor and the first turn of the second conductor such that the flux generated in the windings is effectively canceled.

2. An RF choke as recited in claim 1, wherein each of said first group and said third groups of windings are contiguously disposed, and in which each of said second group of windings are adjacently disposed but spaced apart from one another.

3. An RF choke as recited in claim 1, wherein said plurality of resistors includes at least three resistors, including a first resistor, a second resistor and a third resistor.

4. An RF choke as recited in claim 3, wherein said first resistor is connected between an unconnected end of said first group of windings and a preselected turn thereof.

5. An RF choke as recite in claim 4, wherein said preselected turn is a raised loop.

6. An RF choke as recited in claim 3, wherein said second resistor is connected between the interconnected ends of said first and second groups of windings and a first preselected turn of said second group of windings.

7. An RF choke as recited in claim 6, wherein said first preselected turn of said second group of windings is a raised loop.

8. An RF choke as recited in claim 3, wherein at least one of said second and third resistors are connected to said second conductor.

9. An RF choke as recited in claim 1, wherein the first diameter is larger than the second diameter.

10. An RF choke as recited in claim 1, wherein said first group of windings has between 6 and 10 turns, said second group of windings has between 5 and 9 turns, and said third group of windings has between 1 and 5 turns.

11. An RF choke as recited in claim 1, wherein each of said first group and said third groups of windings are contiguously disposed, and in which each of said second group of windings are adjacently disposed but spaced apart from one another.

12. An RF choke as recited in claim 1, wherein said core is made from a substantially ferrite material, and in which the first diameter of said core is larger than the second diameter of said core.

13. An RF choke comprising:
   an elongated core having respective first and second diameters;
   a first group of windings defining a first conductor wound around one of said core diameters;
   a second conductor defined by respective second and third groups of windings wound around the other of said core diameters, each of said second and third groups of windings being wound around said core in a winding direction which is opposite a winding direction of said first group windings;
   each of said first, second and third groups of windings are connected to each other at respective ends in series, with said second group being disposed between said first and third groups of windings;
   said first and second conductor having a spacing therebetween which forms an interconnection point therebetween;

at least three resistors including a first resistor, a second resistor, and a third resistor;

said second resistor connected between the interconnected ends of said first and second groups of windings and a first preselected turn of said second group of windings; and said third resistor is connected between said first preselected turn and a second preselected turn of said second group of windings.

14. An RF choke as recited in claim 13, further including a fourth resistor, said fourth resistor being connected between said preselected turn of said first group of windings and said interconnected ends of said first and second groups of windings.

15. An RF choke as recited in claim 14, further including a fifth resistor, said fifth resistor being connected between said second preselected turn of said second group of windings and an unconnected end of said third group of windings.

16. An RF choke as recited in claim 13, further including a fourth resistor, said fourth resistor being connected between said second preselected turn of said second group of windings and an unconnected end of said third group of windings.

17. A RF processing circuit having an input terminal and at least one output terminal, wherein an RF signal and an AC power signal are present on said input terminal and also present on said at least one output terminal, said circuit comprising:

an RF circuit, wherein only said RF signal is passed into said RF circuit so that said RF signal can be processed, said RF circuit having an input lead and at least one output lead;

means for blocking said AC power signal from passing into said RF circuit at said input lead and at least one output lead;

an RF choke coupled to said input and output terminals in parallel with said RF circuit, said RF choke passing said AC power signal and blocking substantially all of RF signal, said choke comprising:

an elongated core having respective first and second diameters;

a first group of windings defining a first conductor wound around one of said core diameters;

a second conductor defined by respective second and third groups of windings wound around the other of said core diameters, each of said second and third groups of windings being wound around said core in a winding direction which is opposite a winding direction of said first group windings;

each of said first, second and third groups of windings are connected to each other at respective ends in series, with said second group being disposed between said first and third groups of windings;

a first, a second, and a third resistor;

said first resistor being connected between an unconnected end of said first group of winding and a preselected turn thereof, said second resistor being connected between interconnected ends of said first and second groups of windings and a first preselected turn of said second group;

said first and second conductors having a spacing therebetween which forms an interconnection point, and said third resistor is connected between said first preselected turn and a second preselected turn of said second group of windings.

18. The RF processing circuit as recited in claim 17, having a fourth resistor connected between said preselected turn of said first group of windings and the interconnection between said first group of windings, and having a fifth resistor connected between said second preselected turn of said second group of windings and the unconnected end of said third group of windings.

19. The RF processing circuit as recited in claim 17, wherein said RF circuit is selected from the group consisting of a line splitter circuit, a line coupler circuit, a trunk amplifier circuit, a bridge amplifier circuit, a line extender amplifier circuit, a line equalizer circuit and a power inserter circuit.

* * * * *